United States Patent [19]

Cole et al.

[11] Patent Number: 5,270,371
[45] Date of Patent: Dec. 14, 1993

[54] ADHESIVE COMPOSITIONS FOR ELECTRONIC PACKAGES

[75] Inventors: Herbert S. Cole, Burnt Hills; James W. Rose, Guilderland, both of N.Y.

[73] Assignee: General Electric Company, Schenectady, N.Y.

[21] Appl. No.: 955,776

[22] Filed: Oct. 2, 1992

[51] Int. Cl.$^5$ .............................. C08K 5/07; C08K 3/36; C08K 3/10
[52] U.S. Cl. ..................... 524/359; 524/403; 524/492
[58] Field of Search ................. 524/359, 403, 492

[56] References Cited

U.S. PATENT DOCUMENTS

| | | | |
|---|---|---|---|
| 3,501,443 | 3/1970 | DiLeone | 524/359 |
| 3,607,814 | 9/1971 | DiLeone | 524/359 |
| 4,377,652 | 3/1983 | Ohmura et al. | 524/403 |
| 4,495,321 | 1/1985 | Arnold | 524/359 |
| 4,565,858 | 1/1986 | Klopfer | 528/172 |
| 5,019,535 | 5/1991 | Wojnarowski et al. | 437/209 |
| 5,145,899 | 9/1992 | Auman | 524/359 |

*Primary Examiner*—Kriellion S. Morgan
*Attorney, Agent, or Firm*—Geoffrey H. Krauss; William H. Pittman

[57] ABSTRACT

Chip adhesives with improved working time comprise a polyetherimide prepared from 2,2-bis[4-(3,4-dicarboxyphenoxy)phenyl]propane dianhydride and bis(4-aminophenyl) sulfone; at least one of silica and conductive metal particles, especially silver particles; and at least one substituted acetophenone as solvent. The preferred substituted acetophenone is 4-methylacetophenone.

14 Claims, No Drawings

ADHESIVE COMPOSITIONS FOR ELECTRONIC PACKAGES

This invention relates to adhesive compositions, and more particularly to compositions useful in multichip electronic packages.

Electronic modules containing large numbers of integrated circuit chips are of increasing wide use in the electronics industry. Recent technology has enabled their manufacture with substantially higher chip density than was formerly the case.

In this technology, many chips are mounted on a single substrate and interconnected through thin film dielectric and patterned metal structures to provide electronic modules of small size and weight and with improved electrical performance. The improved performance is the result of close packing of the chips and resultant short interconnect length, with consequent very rapid signal propagation from chip to chip. It is now possible to pack chips so close together on a ceramic substrate that the chip density approaches 90% of the substrate area.

Moreover, techniques have been developed for producing multilayer interconnections between said chips. A "chips first" high density interconnect system is described in U.S. Pat. Nos. 4,783,695 and 4,918,811; in its construction, the chips are placed on a substrate and the interconnect structure is then laid down as an overlay. There is also a "chips last" system, in which the chips form an overlay on thin film dielectric and patterned metal regions.

In a typical "chips first" high density interconnect design, chip cavities are cut in a ceramic substrate and power and ground lines and I/O pads are formed on the surface of the ceramic by depositing, patterning and etching conductive metal layers. Silicon chips are then bonded in the cavities with a thermoplastic adhesive, a process generally known as "die-attach". A polyimide sheet is laminated over the chip-filled substrate and vias are drilled through the polyimide to the chip pads, which are located by laser action. Conductive films are then deposited, patterned and etched to produce interconnects. This last process is typically repeated to produce a multilayer overlay.

Die-attach adhesives used in high density interconnect systems include both conductive and non-conductive materials, with conductive adhesives being used when grounding of the chip is desired. Both thermoplastic and thermosetting resins may be employed in such adhesives. The use of a thermoplastic resin is often preferred because it permits defective chips to be removed and replaced. When a thermosetting adhesive is used, there is no way to remove a damaged chip without severely damaging the substrate. With thermoplastic adhesives, it is possible to peel off the overlay carefully, heat the substrate to melt the adhesive, remove the chip and replace it with an undamaged one. Such a repair scheme is disclosed, for example, in U.S. Pat. No. 4,878,991.

Various types of polyimides are in use as thermoplastic die-attach adhesives. Among them are polyetherimides prepared from 2,2-bis[4-(3,4-dicarboxyphenoxy)phenyl]propane dianhydride, also known as "bisphenol A dianhydride", and bis(4-aminophenyl) sulfone. For the sake of brevity, such polyimides will be referred to hereinafter as "BPADA-SDAN polyetherimides". They may be employed as such or as the polyamic acid precursors. One advantage of the use of BPADA-SDAN polyetherimides is their very high glass transition temperature, on the order of 250° C., and their high melt viscosity. This permits the chip to be accurately and immovably placed, facilitating laser location of the pad with certainty.

Typical die-attach adhesive compositions have been formulated by dissolving the BPADA-SDAN polyetherimide in such solvents as acetophenone, to form a viscous solution which may be applied to the substrate in a dot pattern, with a unique system of dots provided for each chip. Following die-attach, the package is heated to evaporate the solvent, leaving the polyetherimide to serve as the actual adhesive material.

It is sometimes found, however, that the adhesive increases in viscosity too rapidly for convenience. For example, acetophenone solutions of BPADA-SDAN polyetherimides may begin to dry after as little as 6 minutes, which is too short a time for die-attach to be completed. As a result, loss of adhesion of the chips to the ceramic substrate may occur and may not be noticed until a later processing stage, requiring inconvenient and expensive reworking.

The present invention provides adhesive compositions with sufficient melt viscosity to function as chip adhesives, as well as working times sufficiently long to ensure reliable die-attach. The adhesive is thermoplastic, facilitating replacement of defective chips. Moreover, the adhesive compositions have thixotropic properties, minimizing chip motion and the required thickness of the adhesive layer.

In one of its aspects, the invention is thermoplastic adhesive compositions consisting essentially of:

a polyetherimide consisting essentially of structural units of the formula

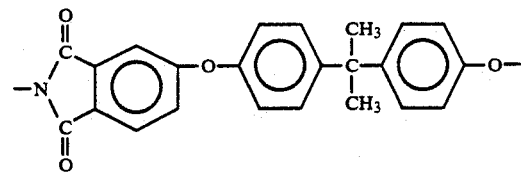

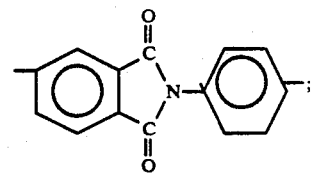

at least one of silica and conductive metal particles in an amount to provide thixotropic properties and conductivity, respectively, or polyamic acid precursor thereof; and as a solvent for said polyetherimide, at least one substituted acetophenone of the formula

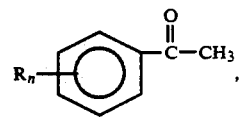

wherein R is methyl, ethyl, methoxy or ethoxy and n is 1 or 2.

The polyetherimide employed in the adhesive compositions of this invention is the aforementioned BPADA-SDAN polyetherimide, which, as previously described, may be employed in the form of the final polyimide or its polyamic acid precursor. Upon heating, the polyamic acid loses water with conversion to the polyimide.

Also present in the adhesive composition is at least one of silica and conductive metal particles. Silica is present as a thixotropic agent, minimizing chip motion and the required glue line thickness of the adhesive layer between the chip and the substrate.

It will be apparent to those skilled in the art that the silica should be employed in extremely small particle size, exemplified by fumed silica and colloidal silica. Fumed silica is preferred, with hydrophobic fumed silica being especially preferred by reason of its low tendency to absorb ambient moisture. Hydrophobic silica may be prepared by treating ordinary silica with a polydimethylsiloxane fluid or the like.

If a conductive die-attach adhesive is desired, the presence of conductive metal particles is necessary. Any suitable conductive metal may be employed; silver and gold are examples, with silver often being preferred. It is normally employed in flake form, the flakes typically having dimensions on the order of 0.5-10 microns.

The solvent employed according to the present invention is a crucial feature thereof. It is at least one mono- or disubstituted acetophenone, the substituents being methyl, ethyl, methoxy or ethoxy groups. Suitable acetophenones include 4-methylacetophenone, 3-methylacetophenone, 3,4-dimethylacetophenone and 3-methoxyacetophenone, which have boiling points between 210° and 250° C. 4-Methylacetophenone (b.p. 226° C.) is generally preferred by reason of its relatively low cost and particular effectiveness.

The proportion of silica in the adhesive compositions of this invention is an effective amount to provide thixotropic properties. It is typically about 1-25% by weight, based on total solids; i.e., on total composition excluding solvent. Similarly, the conductive metal is present in an amount effective to provide conductivity, typically about 55-75% by weight based on total solids. The solvent is present in an amount effective to provide the desired melt viscosity and workability. It usually comprises about 55-85% of total composition including solvent.

The compositions of this invention may also contain other materials which do not materially affect their basic and novel characteristics. Such materials may include, for example, substances added to improve thermal conductivity. Illustrative substances of this type are aluminum nitride powder and diamond powder.

Another aspect of the invention is an electronic circuit structure comprising a substrate, usually a ceramic such as alumina, aluminum nitride or aluminum-silicon carbide composite or a metal or metalloid such as iron-nickel-cobalt-manganese alloy or silicon, and at least one integrated circuit chip adhered to said substrate with an adhesive composition as described hereinabove. A plurality of chips is usually present, with an interconnect pattern, preferably comprising thin film dielectrics and patterned metal interconnections as previously described, provided therefor.

The invention is illustrated by the following examples. All parts and percentages are by weight.

EXAMPLES 1-3

Mixtures of BPADA-SDAN polyetherimide, 4-methylacetophenone and silver flakes and/or a hydrophobic fumed silica commercially available under the designation "Cab-O-Sil TS-720" were prepared and warmed at 100° C., with occasional stirring, until uniform. The formulations employed are listed in the following table.

|  | Example | | |
|---|---|---|---|
|  | 1 | 2 | 3 |
| BPADA-SDAN polyetherimide, %[1] | 80 | 33 | 32.6 |
| Silica, %[1] | 20 |  | 2.2 |
| Silver flakes, %[1] |  | 67 | 65.2 |
| 4-Methylacetophenone, %[2] | 82 | 65.4 | 65 |

[1] Excluding solvent.
[2] Including solvent.

The adhesive compositions thus prepared were dispensed in conventional manner on an alumina substrate and chips placed thereon after various time increments. It was found that the working times of the adhesive compositions were on the order of 19 minutes. Control samples, in which the 4-methylacetophenone was replaced by acetophenone, had working times only on the order of 6 minutes.

What is claimed is:

1. A thermoplastic adhesive composition consisting essentially of:

a polyetherimide consisting essentially of structural units of the formula

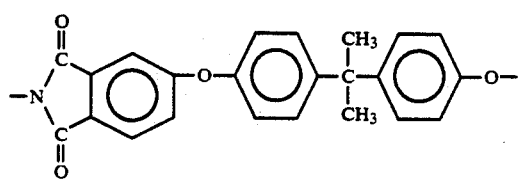

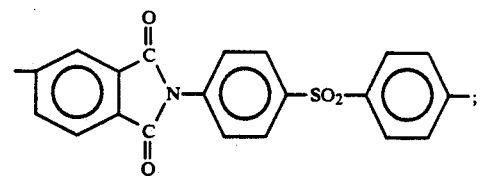

at least one of silica and conductive metal particles in an amount to provide thixotropic properties and conductivity, respectively, or polyamic acid precursor thereof; and as a solvent for said polyetherimide, at least one substituted acetophenone of the formula

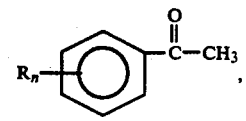

wherein R is methyl, ethyl, methoxy or ethoxy and n is 1 or 2.

2. A composition according to claim 1 which contains silica in the amount of about 1-25% by weight based on total solids.

3. A composition according to claim 2 wherein the silica is fumed silica.

4. A composition according to claim 2 wherein the silica is hydrophobic silica.

5. A composition according to claim 1 which contains conductive metal in the amount of about 55–75% by weight based on total solids.

6. A composition according to claim 5 wherein the conductive metal is silver.

7. A composition according to claim 1 wherein the solvent is present in the amount of about 55–85% of total composition including solvent.

8. A composition according to claim 1 wherein the solvent is 4-methylacetophenone.

9. An electronic circuit structure comprising a substrate and at least one integrated circuit chip adhered to said substrate with an adhesive composition according to claim 1.

10. A structure according to claim 9 wherein the substrate is a ceramic.

11. A structure according to claim 9 wherein the substrate is a metal or metalloid.

12. An electronic circuit structure comprising a substrate and at least one integrated circuit chip adhered to said substrate with an adhesive composition according to claim 8.

13. A structure according to claim 12 wherein the substrate is a ceramic.

14. A structure according to claim 12 wherein the substrate is a metal or metalloid.

* * * * *